United States Patent [19]

Koford

[11] Patent Number: 5,568,636
[45] Date of Patent: Oct. 22, 1996

[54] METHOD AND SYSTEM FOR IMPROVING A PLACEMENT OF CELLS USING ENERGETIC PLACEMENT WITH ALTERNATING CONTRACTION AND EXPANSION OPERATIONS

[75] Inventor: James S. Koford, San Jose, Calif.

[73] Assignee: LSI Logic Corporation, Milpitas, Calif.

[21] Appl. No.: 306,385

[22] Filed: Sep. 13, 1994

[51] Int. Cl.$^6$ .............................. G06F 3/00; G06F 15/00
[52] U.S. Cl. ........................... 395/500; 364/489; 364/491
[58] Field of Search .................................... 364/488, 489, 364/490, 491, 578; 395/500

[56] References Cited

U.S. PATENT DOCUMENTS

| | | | |
|---|---|---|---|
| 4,636,966 | 1/1987 | Yamada et al. | 364/491 |
| 5,191,542 | 3/1993 | Murofushi | 364/491 |
| 5,224,056 | 6/1993 | Chene et al. | 364/490 |
| 5,309,371 | 5/1994 | Shikata et al. | 364/491 |
| 5,359,538 | 10/1994 | Hui et al. | 364/491 |

OTHER PUBLICATIONS

Preas, Bryan T, and Lorenzetti, Michael J., Physical Design Automation of VLSI Systems, The Benjamin/Cummings Publishing Company, 1988, pp. 116–117 Jan./1988.

Sherwani, Naveed, Algorithms For VLSI Physical Design Automation, Kluwer Academic Publishers, 1993, pp. 173–174 Jan./1993.

Primary Examiner—Kevin J. Teska
Assistant Examiner—Jacques Louis-Jacques
Attorney, Agent, or Firm—Poms, Smith, Lande & Rose

[57] ABSTRACT

A method of cell placement for an integrated circuit chip includes performing a contraction operation by which at least some of the cells are relocated to new positions that provide lower interconnect wirelength. For each cell, the centroid of the net of cells to which the cell is connected is computed. The cell is then moved toward the centroid by a distance that is equal to the distance from the current position of the cell to the centroid multiplied by a "chaos" factor. This process continues until a specific energy condition is met; then the 'expansion' mode is entered. An expansion operation is then performed by which the net force exerted on each cell by other cells in the placement and a resulting altered velocity of the cell are calculated, and a new cell position is calculated based on the altered velocity over an incremental length of time. The system stays in expansion mode until another energy criterion is met. The contraction and expansion modes are repeated in alternation, with the expansion operation preventing the cells from being undesirably converged by the contraction operation. At the start of each expansion operation, a normalization operation is performed to prevent skewing of the cells along a particular axis.

31 Claims, 6 Drawing Sheets

METHOD AND SYSTEM FOR IMPROVING A PLACEMENT OF CELLS USING ENERGETIC PLACEMENT WITH ALTERNATING CONTRACTION AND EXPANSION OPERATIONS

BACKGROUND OF THE INVENTION

1. Field of the Invention

The present invention generally relates to the art of microelectronic integrated circuits, and more specifically to a method of generating an optimized placement of cells for an integrated circuit chip using energetic placement with alternating contraction and expansion operations.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including force directed placement or simulated annealing, constructive placement, or Genetic Algorithms such as simulated evolution, and comparing the resulting placements using a cost criteria.

The field of optimization is very old. Simple mathematical optimizations have been performed since antiquity. Newton and Leibnitz's invention of calculus provided a breakthrough in the tools available, and following developments such as the calculus of variations, statistical optimization, and programming methods (linear and integer) have produced optimization techniques that are very effective for a significant class of problems.

Typically, an optimization problem involves a system whose configuration is specified by a set of numbers. There is a "cost" function that can be evaluated for any given set of values for the numbers; the "optimum" configuration is that which has the minimum cost over all possible assignments of values to the set of numbers. Usually, the set of numbers is a finite set, but an important class of optimization problems involves an infinite set of numbers.

A problem like the famous Traveling Salesman Problem (What is the best route to visit a given set of cities to minimize travel time?) involves a finite set of numbers (list the city numbers in the order they are to be visited), while an optimal-trajectory problem (What is the best way to fly an airplane to a given altitude above a sea-level takeoff so that fuel consumption is minimized?) involves an infinite set of numbers (there are an infinite number of points in a continuous trajectory function).

Unfortunately, a large class of optimization problems belong to what is known as the NP-complete class of problems; i.e., problems whose solutions cannot be found in polynomial time by algorithms implemented on modern computers. These optimization problems are usually solved "heuristically", i.e., with algorithms that search as wide a range of feasible configurations as possible, evaluate a function giving a configuration's cost, and hope to "visit" a configuration with a very low cost, i.e., a near-optimal solution.

Clever algorithms have been devised that perform "directed searches", i.e., searches that do not waste time examining configurations known in advance to have suboptimal cost values.

A placement methodology exists in the art that is generally known as "force directed placement". In this method, interconnected cells are represented as masses that exert attractive forces on each other, where the attractive forces are proportional to the distances between the cells. If the cells are allowed to move freely, each cell moves in the direction of the resultant force on it until the system achieves equilibrium.

If all of the cells in the network are allowed to move freely, the system will achieve equilibrium when all the interconnected cells occupy the same location, i.e., they are on top of each other. Since such a placement is physically unfeasible, several different methods have been tried to prevent this "collapse."

In most practical designs, fixed cells or pads at the periphery of the placement area "pull" the inner movable cells apart, so that a feasible placement is achieved. In other formulations, "repulsive" forces between the elements prevent collapse.

Although effective to a limited extent, these prior art methods encounter difficulties in producing effective placements for extremely large integrated circuit chips containing hundreds of thousands or even millions or more cells. A need exists for a placement methodology that provides this capability, especially in view of continuous advancements in fabrication technology that enable such large numbers of cells to be formed on a single chip.

SUMMARY OF THE INVENTION

An object of the present invention is to provide a general force-directed method whereby new VLSI placement optimization techniques can be developed for parallel implementation.

The configuration being optimized is a given network of interconnected elements, called "cells". Each cell in the network is specified to be connected to a fixed set of one or more other cells.

The given interconnection of the cells is often called a netlist. The optimization problem consists of geometrically placing the cells in space so as to minimize a given global cost function that is also a given input to the problem.

This present method is able to accomplish results including the following.

1. "Discover" a "natural" configuration that best places (i.e., minimizes the cost function of) a netlist. The only givens are the netlist itself and the cost function parameters. Netlists with no "fixed" cells (i.e., the method can select a location for each cell in the netlist) are allowed.
2. Avoid getting "trapped" in solutions where the cost function is at a local minimum, i.e., the method keeps "exploring" related configurations to see if better placements can be found.
3. Operate very efficiently in a parallel computer with many computing elements operating simultaneously with relatively little communication required among them.
4. Optimize very general networks with any number of fixed or movable elements.
5. Produce resultant layouts that effectively minimize cost functions.
6. Allows interactive operation in connection with other partitioning or clustering techniques to allow the solution of very large optimization problems.
7. Perform basic optimizations on networks containing millions of elements.

The present method can be used as part of a larger heuristic optimization system. It is based on a simple model that typically does not taken into account all of the complexities inherent in a given difficult optimization problem. However, this model may be very effective in getting a good global solution relatively quickly.

The present method is expected to "visit" a low-cost global configuration; a more detailed model can then be used for "optimization improvement" to find the best solution.

The present method is able to "solve" placements that have proven difficult for other methods, such as simulated annealing and/or genetic algorithms. In particular, the present method is able to find low-cost placements for networks with no fixed pads or cells. This type of network could not be handled with most prior art algorithms. The present method can place large mesh networks very quickly, a result which is generally not achievable with prior art algorithms such as simulated annealing and genetic placement.

Another disadvantage of some of the older methods is that they either partition a graph for some other placement algorithm or they place a graph that is already partitioned. Since the present method can find "clusters" of elements while also placing the clusters, it is able to attack the problems of partitioning and placement simultaneously.

More specifically, a method of cell placement for an integrated circuit chip in accordance with the present invention includes performing a contraction operation by which at least some of the cells are relocated to new positions that provide lower interconnect wirelength.

Cells are selected at random, and the centroid of the net of cells to which the cell is connected is computed. The cell is then moved toward the centroid by a distance that is equal to the distance from the current position of the cell to the centroid multiplied by a "chaos" factor. This process continues until an energy measure drops below a threshold; then the system switches to the 'expand' mode.

An expansion operation is then performed by which the net force exerted on each cell by other cells in the placement and a resulting altered velocity of the cell are calculated, and a new cell position is calculated based on the altered velocity over an incremental length of time.

The contraction and expansion operations are repeated in alternation, with the expansion operation preventing the cells from being undesirably converged by the contraction operation.

At the start of each expansion operation, a normalization operation is performed to prevent skewing of the cells along a particular axis.

The present invention provides a method of cell placement utilizing parallel simultaneous processors that is especially suited to integrated circuit cell placement optimization.

The present method is not limited to any specific application, however, and might be advantageously applied to optimization problems in a number of diverse areas such as logic synthesis, circuit optimization (for minimum power, etc.), software optimization, logistical problems such as traffic control and routing.

In general, the present method can be utilized to obtain solutions to optimization problems having many simple or complex variables that are interrelated. For example, further applications of the invention include financial market and investment analysis, currency arbitrage, weather forecasting, seismic and nuclear analysis and maintenance of complex databases.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
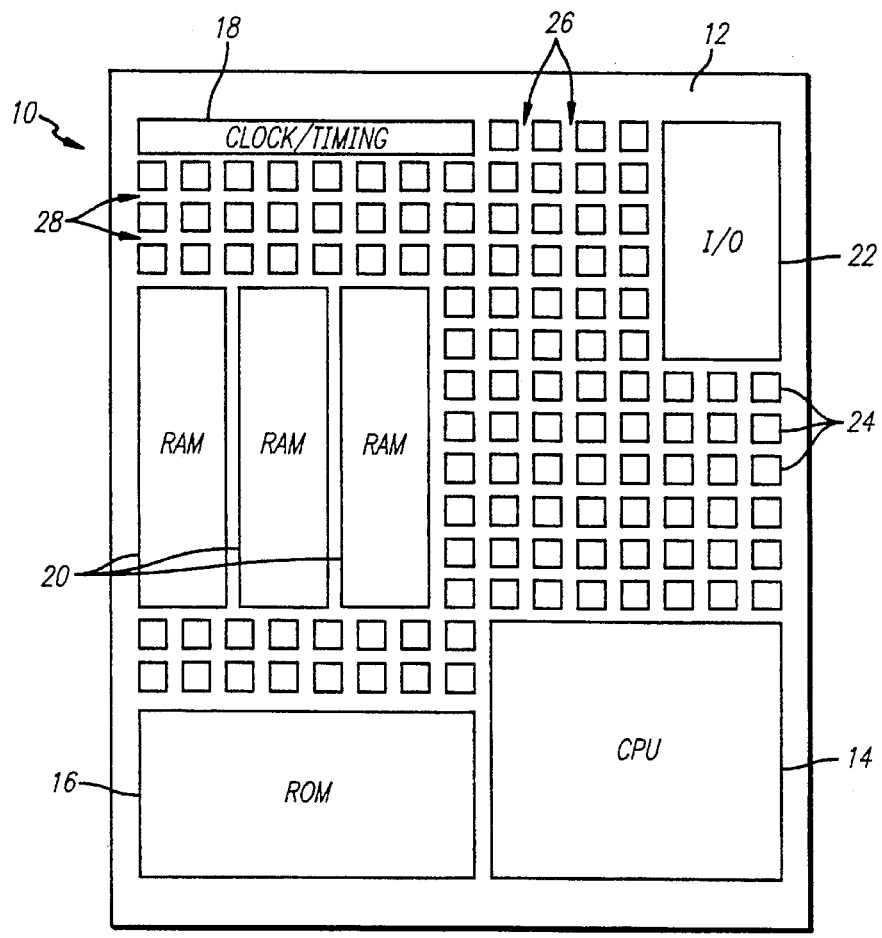
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
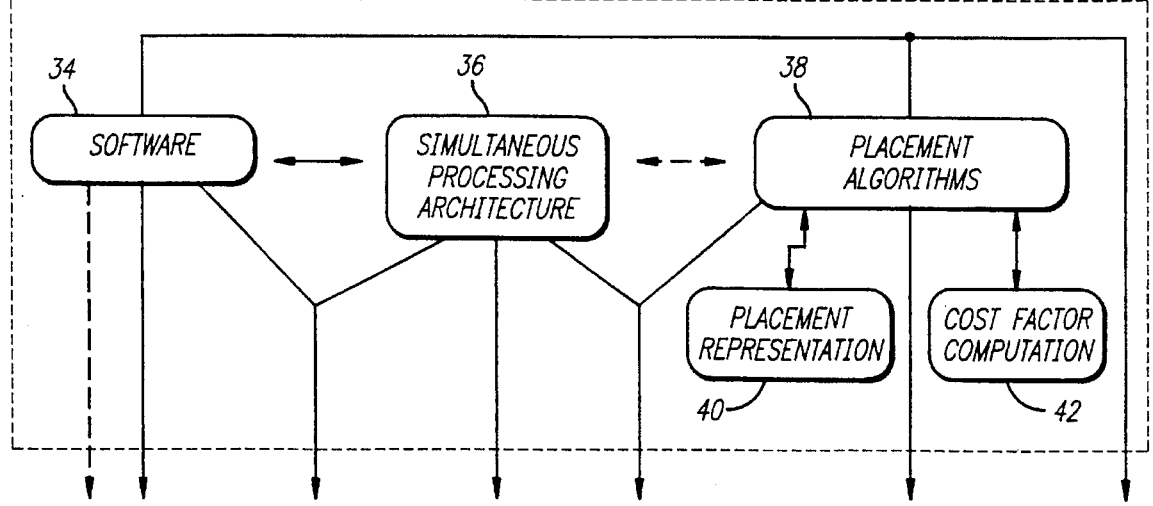
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The architecture 36 collectively implements the functions of an initial placement generating means, placement representation means, contraction means, expansion means, control means and computing means by assigning different parallel processors to perform these functions and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

Physical systems operate in parallel. All elements in a conventional operating electronic circuit process signals simultaneously; all molecules in a fluid move simultaneously; all bodies in the solar system move simultaneously, etc. Furthermore, the elements in a physical system are often primarily influenced by their "neighbors": planets (at least ones of equal mass) are most strongly influenced by other planets close to them; an electronic circuit component is influenced at any point in time only by other components connected directly to it via wires or fields; molecules in a fluid are affected only by neighboring molecules, etc.

Thus, physical systems exhibit the locality and parallelism that is required for improved optimization methodologies using the architecture 36.

In recent years, an exciting new branch of physics known as "chaos theory" has attracted wide attention. Chaos theory studies the behavior of large, nonlinear dynamical systems. The earlier linear mathematical tools could not be directly applied to such systems, and the study of them awaited the arrival of modern computers where their behavior could be simulated and observed with powerful supercomputers.

Many of the systems that are studied in such computers are simulations of real nonlinear physical systems, such as the motion of molecules in a fluid. However, there is no reason that a dynamical system simulated in a computer needs to have a real-world physical analog.

Computers can evaluate virtually any set of dynamical equations in accordance with any set of rules specified by an algorithm designer. We have already witnessed some remarkable mathematical structures, such as Mandelbrot sets, which were discovered primarily through a computer implementation.

The present invention applies the concept of "Virtual Physics" to the placement problem using a class of algorithms known as "Force-Directed" placement algorithms. In these algorithms, the netlist is modeled by assuming that each cell is a connection point for "springs" that connect it to other cells. Thus, "wires" in the netlist become "springs," and cells become connection points connecting the ends of one or more springs.

The method of the present invention can be stated in very general terms as:

1. Create a "virtual" dynamical system (elements, rules of interactions among the elements, overall state measure, and overall external influences) whose configuration is the analog of the configuration of a real-world optimization problem. In the current embodiment, this dynamical system is linear, but the technique described herein is not limited to linear systems.

2. Implement this virtual system in one or more processors, and develop the external influences to "nudge" the system through states where the state measure passes through minimums.
3. "Remember" minimums, and when the state measure reaches a stable point or goes to higher values, stop, and map the virtual physical state back to the real world as a solution to the optimization problem.

The cells are placed in some initial configuration on a plane, and common mathematical techniques are used to compute the minimum-energy configuration of the springs.

If there are no fixed cells (i.e., pads) in the design, a conventional force-directed algorithm yields a trivial and uninteresting solution: all cells on top of one another with all springs having zero length. (The [linear] springs have a restoring force proportional to their lengths).

In its simplest form, the problem specification starts with a "netlist" which is a data file that lists all the circuit elements in the design (hereinafter referred to as "cells") and the interconnections (i e., "wires") between them. Each interconnection represents a set of pins on a set of cells that are to be electrically connected in the final VLSI chip layout.

The object of the placement methodology is to find a position on a plane for each cell so that the cells do not overlap and there is enough room on the plane for the wires to run among the cells so that all of the interconnections specified by the netlist can be realized.

Because modern chip designs involve tens of thousands of cells and only a few routing layers (2 to 4), the optimum placement problem is extremely difficult, and belongs to a class of problems known as "NP-complete," for which algorithmic solutions in polynomial time do not exist.

Therefore, the placement problem must be approached "heuristically"; i.e., with "search rules" and evaluations of "cost" functions to find near-optimal solutions in polynomial time. For example, the a statistical algorithm like simulated annealing selects potential cell swaps, and then evaluate a cost function like total wirelength. If the "swap" leads to lower total wirelength, it is "kept".

Depending on the state of the annealing schedule, a swap that increases the overall wirelength may also be kept. The simulated annealing algorithm is based on this feature because it leads to a controlled exploration of many more possible placements than would be the case if only cost-improving swaps were examined.

In accordance with the present method, cells are modeled as masses, and the interconnections among them are modeled as ideal, linear, springs (i.e., the force pulling the ends of the springs together is proportional to the length of the spring).

Initially, the cells are placed in uniformly-distributed random positions on the chip plane. As the method progresses, it alternates between a contracting state and expanding state. In the contracting state, a cell is selected at random, and an equilibrium position for it is computed (the point at which the resultant spring force is zero in all directions).

The cell is then permitted to move from its current point to the equilibrium point a fraction "lambda" $\lambda$ of the distance between the two points. Another cell is selected at random and the same computation is performed.

For small lambda ($<<1$) the cell positions converge to a minimum (potential) energy state. If there are sufficient fixed pads, a reasonable placement is found that minimizes the overall wire (i.e., spring) length. However, if the fixed pads do not "pull the cells apart" enough, the cell positions crowd in to the center of the chip, and a useless result is obtained.

To prevent this condition, the total potential energy in the springs during the contracting state is monitored. When this energy drops below an algorithmically determined threshold, kinetic energy is added and the method switches to the expanding state.

In preparation for the expanding state, each cell is given a velocity outward from the system center of gravity. The velocities are normalized in accordance with a regression-line calculation so as to keep the overall placement as rectangular as possible. Once the initial velocities have been injected into the cells, the system of cells and springs is simulated in accordance with classical (Hamiltonian) mechanics.

As the method progresses, the kinetic energy of the masses is transferred to potential energy in the springs, and the outward expansion slows, and finally stops. The contraction phase begins, as the springs begin to pull the masses back toward their center of gravity. When the contraction reaches a minimum dimension, outward kinetic energy is reintroduced, and the expansion phase begins, etc.

Figure 3:
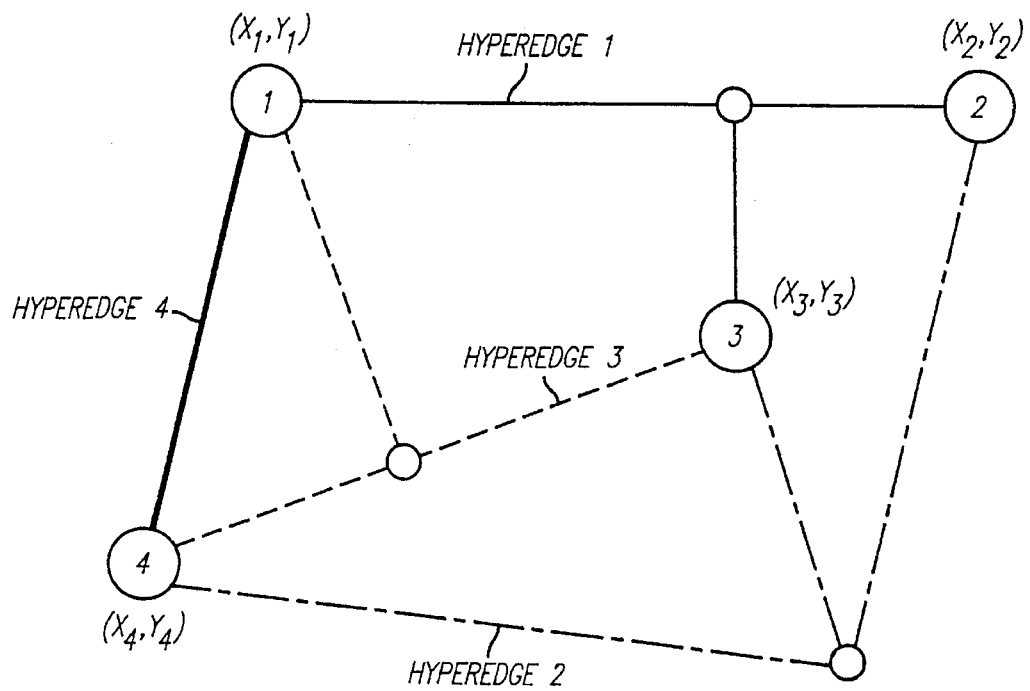
FIG. 3 is graph illustrating a net of cells represented as a hypergraph including vertices and hyperedges.

A cell network consisting of the individual nets of the netlist can be represented using graph theory as a hypergraph H as illustrated in FIG. 3. The cells are represented as a set of vertices $V=\{v_i\}$, and the interconnection among the cells is represented by a set of hyperedges $E=\{e_i\}$. The graph H is thus the pair of the vertex set and the hyperedge set, such that $$H=[V,E] \qquad \text{Equ. (1)}$$

Each hyperedge $e_i$ is a set of vertices that are all assumed to be connected together, as $$e_i=\{v_{i1},v_{i2},\ldots,v_{it}\} \qquad \text{Equ. (2)}$$

A hyperedge may contain from two to t vertices, where t is the total number of vertices in the graph. If the number of vertices in a hyperedge is just 2, then the hyperedge becomes a simple edge in the hypergraph.

A given vertex may be contained in one or more hyperedges. This is equivalent to saying that any number of vertices (i.e., cells) may be connected by a hyperedge and that each vertex may participate in several different interconnections.

The abstract optimization problem consists in finding a location $p_i$ for each vertex $v_i$ of the hypergraph such that a given global cost function $$C=f(\{p_i\}) \qquad \text{Equ. (3)}$$

is minimized. The preferred cost function for practicing the present method is the total wirelength of the placement (i.e., all of the wires in all of the interconnect nets), although the invention is not so limited.

The set of locations $P=\{p_i\}$ can be assumed in general to be defined in a space of any dimension; however the layout problems used as examples in this disclosure will be confined to two dimensions with coordinates for vertex $v_i$ designated by $p_i=(x_i,y_i)$. However, the present method is quite general with respect to the dimensionality of the coordinate space, and can be applied to a space of any dimension.

FIG. 3 illustrates a two-dimensional hypergraph (netlist) with four vertices (cells) and 4 hyperedges (electrical interconnections). The vertices are represented by numbered dots, and the hyperedges are distinguished by the different types of lines (unbroken, bold, dashed, and dot-dash). Associated with each vertex is its 2-dimensional coordinate $p_i=(x_i,y_i)$.

An additional concept to be introduced is that of the derived graph. Each interconnection in the network can connect two or more cells or vertices. Thus, when the problem was formulated in graph theoretic terms, it produced a hypergraph in which each edge can connect two or more vertices.

To overcome this problem, the hypergraph is then transformed into a derived graph: i.e., a network where each connection connects exactly two vertices. This is done by adding special connected trees of vertices to the network until no connection includes more than two vertices.

Figure 4:
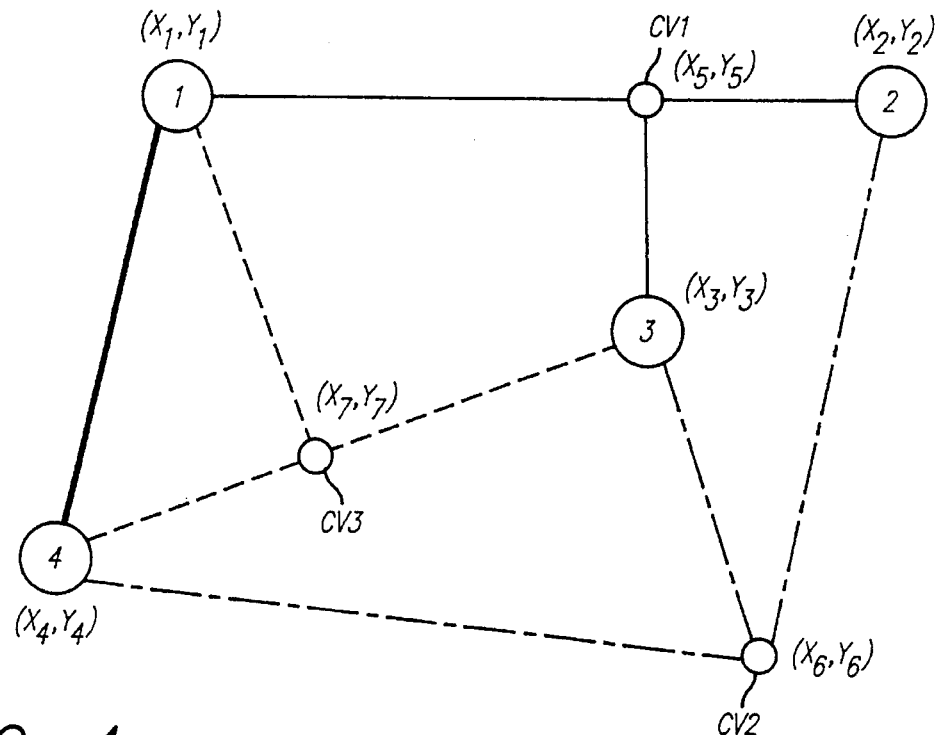
FIG. 4 is similar to FIG. 3, but illustrates the net as represented a simple graph including vertices, connection vertices and edges.

In general, there are many different ways to do this for a given graph. However, the preferred method is to convert each hyperedge (3 or more connected vertices) to a "star" configuration. This is done by adding additional vertices that are designated as connection vertices CV1 to CV4 to the original hypergraph of FIG. 3 as illustrated in FIG. 4. Each vertex in the original hyperedge is connected to the connection vertex. The connection vertex thus becomes the hub of a star configuration with each hyperedge vertex at the end of one of the "points" of the star.

In graph-theoretic terms, a derived graph G is designated as $$G=[N,L] \qquad \text{Equ. (4)}$$

The derived graph G is thus the pair of the set of vertices N, and of the set of edges L. From the above, it is seen that the set $N=\{n_1,n_2,\ldots,n_m\}$ is the union of the set V (the original set of vertices of the hypergraph) and the new set $C=\{c_1,c_2,\ldots,c_k\}$ of connection vertices. The set $L=\{\mathbf{1}_1,\mathbf{1}_2,\ldots,\mathbf{1}_w\}$ is the union of the set of all edges in the original hypergraph that connected only two points and of the set of new edges that connect the original vertices in the hypergraph to the connection vertices in set C.

The same notation used above is applied to denote the position of the vertices in the derived graph; i.e., $P=\{p_1,p_2,\ldots,p_m\}$, where $p_i=(x_i,y_i)$ denotes the cartesian coordinates of vertex $n_i$.

Based on the graphic representation as illustrated in FIG. 4, the present method comprises the following general steps.

1. Represent the nodes of the graph (cells) as physical "masses" which can have velocities and momentum.
2. Model the edges of the graph as springs which try to pull the masses together.
3. Set the system in motion in accordance with modified laws of motion that govern the interactions among the elements. Since these modified laws of motion do not totally correspond to physical reality, they are referred to as "virtual physics".
4. In the current example, the cost function is total wirelength, which is proportional to the stored "energy" in the spring models. This is designated as the "potential energy" of the system. As the system moves, a cost function is evaluated as implemented by the representations.
5. The "kinetic energy" of the system, i.e., the energy in the momentum of the cells represented as moving masses, is also monitored. A control system is implemented that monitors these kinetic and potential energies to switch back and forth between states where the system is expanding and contracting so as to improve the cost function.
6. Positions and velocities are modified to keep the networks without pads from collapsing.
7. The process is terminated when a specified number of iterations has occurred or no further improvements have been observed in the cost function.

The present method utilizes the derived graph defined above, where the graph is modeled or represented as a set of masses interconnected by springs. The vertices (cells) of the graph are the masses. Each vertex has a position and a velocity associated with it.

The edges of the graph are modeled as springs. Each spring connects exactly two masses.

The springs are assumed to be ideal linear springs with a minimum length of 0. A form of Hooke's law is used such that $$F=-k_h x \qquad \text{Equ. (5)}$$

The force F is the force exerted by the spring on its ends, x is the length of the spring, and $k_h$ is Hooke's constant for the spring. The force is shown as negative to indicate that for positive x the force acts in the opposite direction; i.e., as a spring is stretched (increasing x) the forces on the ends of the spring oppose the movement (negative x).

Letting $k_h=1$, the potential energy, the energy stored in the springs for a given set of coordinates, is given by:

$$E_v = \frac{1}{2} \sum_{j=1}^{j_e} l_j^2 \qquad \text{Equ. (6)}$$

where $j_e$ is the total number of springs (edges) and $l_j$ is the length of the $j^{th}$ spring.

Similarly, the kinetic energy, the energy in the moving masses (vertices), is given by:

$$E_k = \frac{1}{2} \sum_{j=1}^{m} v_j^2 \qquad \text{Equ. (7)}$$

where $v_j$ is the velocity of the $j^{th}$ mass.

Figure 5A:
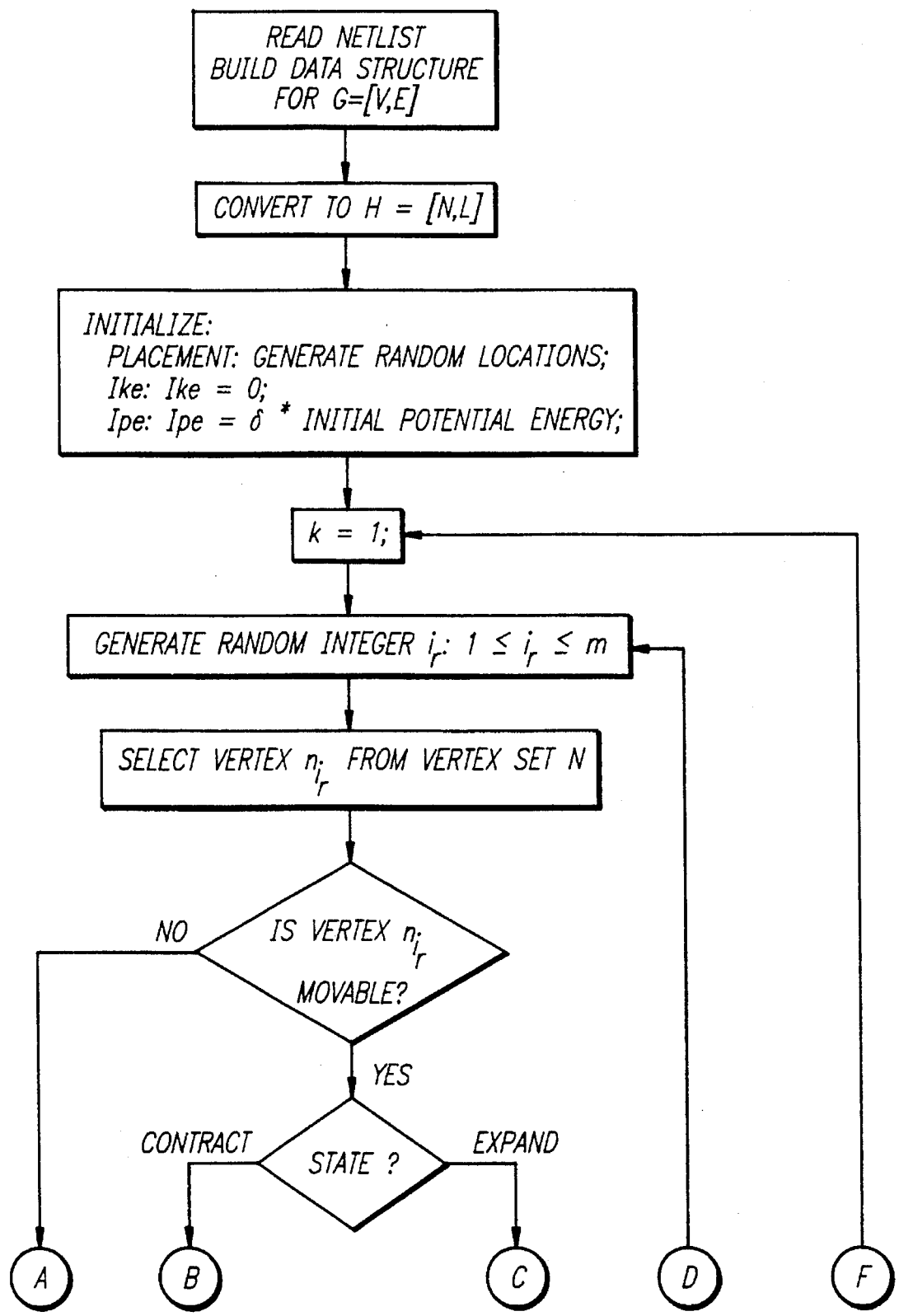
FIGS. 5a to 5c n combination constitute a flowchart illustrating the present method.
Figure 5B:
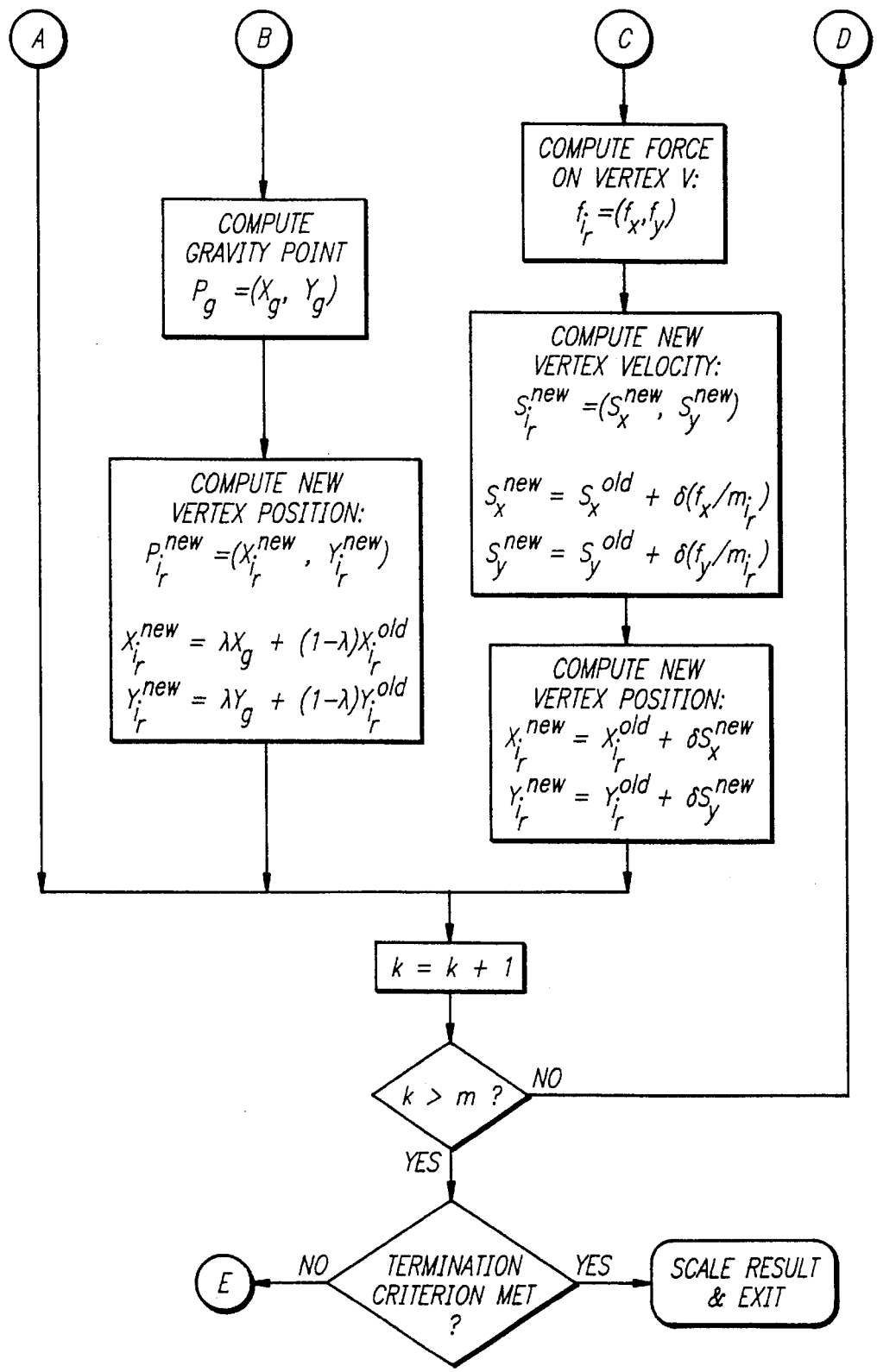
Figure 5C:
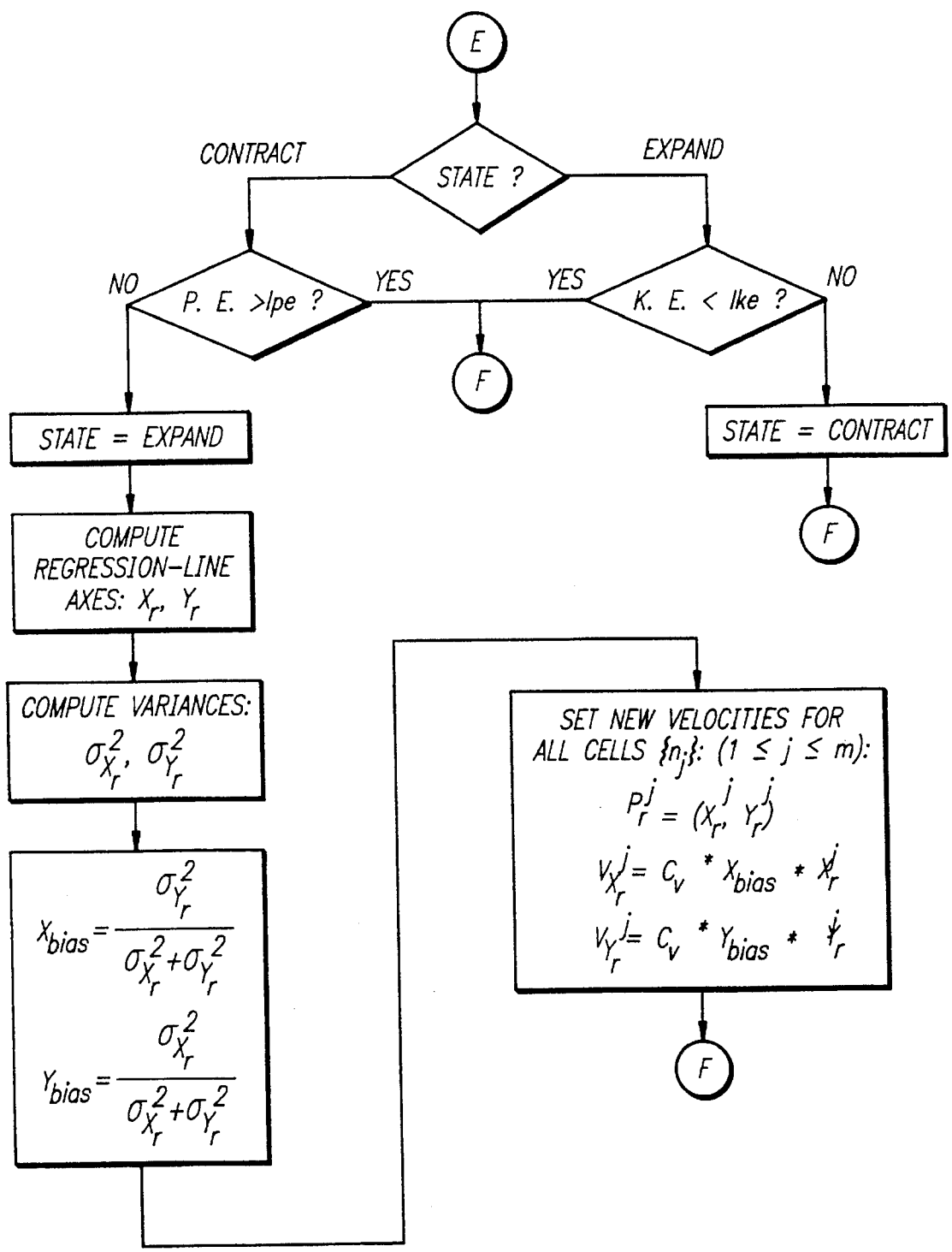

A flow chart of the present method is presented in FIGS. 5a to 5c. First, the hypergraph describing the netlist is read and converted to the derived graph representation described above. The remainder of the method operates on the derived graph until a termination condition is reached.

Although not part of the invention and not described in detail, a succeeding method can be used to take a node-coordinate set P that is produced by the present method, apply these coordinates to the original hypergraph, and use this set to place the vertices of the original hypergraph in legal cell locations on a physical chip architecture.

The vertices are initially placed at random coordinate locations within the chip area. Velocities are set to 0. A counter, k, is initialized to 1, and a variable STATE is set to CONTRACT. The contraction gain, $\lambda$, and the expansion gain, $\delta$, are read as input. The threshold kinetic energy, lke, is set to 0, and the threshold potential energy, lpe, is set to $\delta$ times the initial potential energy. (This choice for lpe is somewhat arbitrary, but has been found to work well in practice.) Then the major iteration loop begins.

Examination of the flow chart will show that any given pass through the main iteration loop will take one of two paths. Which path the program takes will be determined by the two valued variable STATE.

When STATE has the value CONTRACT, the processing steps on the left side of the diagram will be followed; when STATE has the value EXPAND, the right side of the diagram will be followed. Correspondingly, the system will be referred to as being either in the "contracting" state or the "expanding" state.

One of the graph vertices is selected at random. All vertices (fixed, movable, node, connection, etc.) are candidates for selection. If the vertex is not movable, another vertex is selected until a movable vertex is found, and designated as a vertex $n_{ir}$.

The program follows a different path for each state. In the contracting state, a "gravity point" is calculated for the vertex. The gravity point for a given vertex in a given configuration is that point for which all the spring forces acting on that vertex would go to zero if the vertex were moved there. All vertices are assumed to be fixed in their current positions except for the vertex that is selected.

Setting $k_{ji}=1$, it can be shown that the gravity point is given by $$P_g = (x_g, y_g) \quad \text{Equ. (8)}$$

where $$x_g = \frac{\sum_{i=1}^{z}(x_i^r)}{k} \quad \text{Equ. (9)}$$

$$y_g = \frac{\sum_{i=1}^{z}(y_i^r)}{k} \quad \text{Equ. (10)}$$

The coordinates of all nodes connected to the selected vertex $n_{ir}$ are given by $$X_r = (x_1^r, x_2^r, \ldots x_z^r) \quad \text{Equ. (11)}$$

$$Y_r = (y_1^r, y_2^r, \ldots y_z^r) \quad \text{Equ. (12)}$$

The cell is then moved in the direction of or toward the computed gravity point. This is done through the use of the given connection gain factor, $\lambda_r$: $0 \leq \lambda \leq 1$, which specifies the fraction of the distance the cell should be moved. If the old and new cell positions are designated by $$P_{ir}^{old} = (x_{ir}^{old}, y_{ir}^{old}) \quad \text{Equ. (13)}$$

$$P_{ir}^{new} = (x_{ir}^{new}, y_{ir}^{new}) \quad \text{Equ. (14)}$$

respectively, the new cell position becomes $$x_{ir}^{new} = \lambda x_g + (1-\lambda) x_{ir}^{old} \quad \text{Equ. (15)}$$

$$y_{ir}^{new} = \lambda y_g + (1-\lambda) y_{ir}^{old} \quad \text{Equ. (16)}$$

If $\lambda=0$, the new cell position is the old cell position, i.e., the cell does not move at all. Conversely, if $\lambda=1$, the new cell position is the gravity point. Thus, the cell can move anywhere from its current position to the gravity point, depending on the value of $\lambda$. A value of $\lambda \sim 0.25$ has been found to produce stable algorithmic behavior with good convergence, although the invention is not limited to any particular value.

As illustrated in the flow chart of FIGS. 5a to 5c, the counter k is then incremented by one. If k is still less than m, which can be equal to n, the number of vertices in the graph, another vertex is chosen at random and the method traverses to the left side of the loop again, moving this new vertex, etc. When k is finally greater than m, the method begins the next operation.

Up to this point, each randomly selected vertex is processed independently. Although the present method is presented sequentially (i.e., vertices are processed one after another), many vertices are preferably processed simultaneously in parallel using the architecture 36 illustrated in FIG. 2.

A common data base is updated each time the coordinates of a vertex are changed. Assuming thousands of vertices and tens to hundreds of processors, disjoint groups of vertices are assigned to individual processors. Then, errors due to "data lag" (processor A is moving a cell, but has not updated the data base yet, and processor B uses the old data to compute a gravity point) will be statistically infrequent, and will "wash out" in the end result.

The next step of the method is to check for a specified termination condition or optimization criteria. For example, the current cost function, such as total wirelength, is compared with the cost function at the end of the previous loop. If the cost functions have not changed by more than a certain given value, the method is terminated. Alternatively, the method can be performed for a given number of iterations.

If the termination condition has been satisfied, the result is scaled. The cell positions are floating point numbers that might be very large or very small, and are scaled to the size of the chip that is being designed. The method is completed at this time.

If the specified termination condition has not been satisfied, it is determined if a state change is required and, if required, the state is changed. If changing from the CONTRACTING state to the EXPANDING state, new velocities are set to normalize the aspect ratio of the layout. This operation is illustrated in FIG. 5c.

The procedure for checking for a state change depends on the current state. If in the CONTRACTING state as described above, the potential energy is calculated and compared with the potential energy threshold, lpe. If the potential energy is greater than lpe, the method remains in the CONTRACTING state and then returns to the top of the main loop. If, however, the potential energy has dropped below the threshold lpe, the method switches to the EXPANDING state, sets the velocities to normalize the aspect ratio, sets the kinetic energy threshold lke to a value of ½ the current kinetic energy, and returns to the top of the loop.

If in the EXPANDING state, the need for a state change is determined by computing the kinetic energy, comparing it with the kinetic energy threshold lke, and switching back to the CONTRACTING state if the kinetic energy is less than the threshold. In switching back to the CONTRACTING state, the potential energy threshold is set to a small fraction of the initial potential energy.

These choices for lke and lpe are somewhat arbitrary, and are determined empirically. It is important that the method cycles back and forth between the CONTRACTING and EXPANDING states. When switching to the CONTRACTING state, the system of masses is allowed to "cool" and lose kinetic energy as the spring forces try to pull the masses (i.e., cells) into positions that minimize total spring (i.e., wire) length.

However, if the process were to continue indefinitely, all cells would try to occupy the same point. So, at some stage, when the potential energy has become too low, the method "injects energy" into the system by setting outward velocities on the masses.

The system is then allowed to expand and convert this new kinetic energy back into potential energy, as the kinetic energy in the momentum of the masses is converted to the potential energy of the stretched springs. When the kinetic energy is spent this way, the system is allowed to collapse (i.e., contract). This cycle continues until the termination condition is reached.

The present method sometimes allows the cells to "align" themselves in an elongated or skewed configuration that expands and contracts. Since the chips on which the cells are being placed are basically square, some mechanism is needed that keeps the configuration rectangular with a 1:1 aspect ratio. This mechanism is designated as a "normalization" operation.

Figure 6:
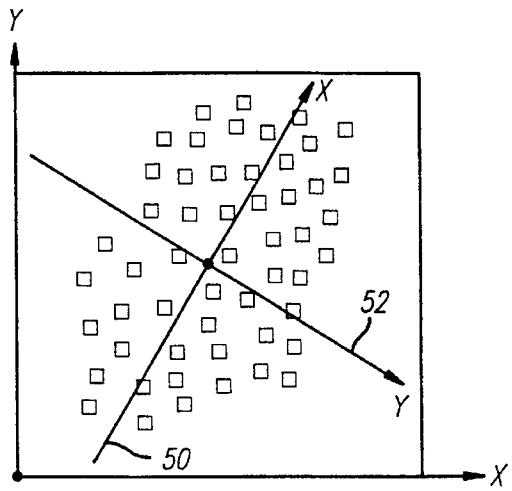
FIG. 6 is a graph illustrating a skew normalization operation of the present method.

The normalization operation is performed at the time of switching from the CONTRACTING state to the EXPANDING state. At that time, a skew axis is calculated as a regression line for the cells as illustrated in FIG. 6 as $$Y = \bar{Y} + b_1(X - \bar{X}) \quad \text{Equ. (17)}$$

where $\bar{X}$ and $\bar{Y}$ are the average x-coordinate and y-coordinate, respectively. The average is taken over all the cells in the graph. Similarly, $$b_1 = \frac{\Sigma x_i y_i - n\bar{X}\bar{Y}}{\Sigma x_2^i - n\bar{X}^2} \quad \text{Equ. (18)}$$

where the averages and sums are taken over all cells in the graph.

The regression line establishes a regression x-axis 50. If the cells were to be grouped more or less along a straight line, the regression line would be a good approximation to that line, and therefore forms a "natural" axis about which the data is distributed.

Using elementary analytic geometry, the perpendicular to the regression line is calculated to establish a "regression y-axis 52. These two axes 50,52 form a regression coordinate system (X,Y) with the origin at the center of gravity of all of the cells.

There are now two coordinate systems: the original coordinate system (x,y), and the regression coordinate system (X,Y) which is a rotation and translation of the original coordinate system (x,y) and is calculated from the natural way in which the cells are distributed at this point. The translation between two different two-dimensional coordinate systems where one is a rotation and translation of the other is a standard problem in analytic geometry.

All the cells are translated to the regression coordinate system (X,Y). Then, x-axis and y-axis variances $\sigma_x$ and $\sigma_y$ are calculated as $$\sigma_x^2 = \sum_{i=1}^{m} X_i - \bar{X}^2 \quad \text{Equ. (19)}$$

$$\sigma_y^2 = \sum_{i=1}^{m} Y_i - \bar{Y}^2 \quad \text{Equ. (20)}$$

where the averages and sums are taken over all cells in the graph.

Two biases $x_{bias}$ and $y_{bias}$ are then calculated as $$x_{bias} = \frac{\sigma_y^2}{\sigma_x^2 + \sigma_y^2} \quad \text{Equ. (21)}$$

$$y_{bias} = \frac{\sigma_x^2}{\sigma_x^2 + \sigma_y^2} \quad \text{Equ. (22)}$$

Finally, velocities are set for each cell, designated by j: $0 < j \leq m$, whose location in terms of the regression-axis coordinate system is $p_r^j = (x_r^j, y_r^j)$ $$V_x^j = C_v * x_{bias} * x_r^j \quad \text{Equ. (23)}$$

$$V_y^j = C_v * y_{bias} * y_r^j \quad \text{Equ. (24)}$$

where $C_v$ is an empirical constant: $C_v < 1$.

A large variance along an axis means that the cells are "spread out" along that axis. Similarly, a small variance means that the cells are bunched. $x_{bias}$ is large when the y variance is large, and $y_{bias}$ is large when the x variance is large. Thus, when the cells are spread out in a line along the regression x-axis 50, for example, the velocities in that direction will be small, and larger along the perpendicular regression y-axis 52. The normalization operation assigns velocities to cells such that the overall cell configuration will be "stretched" in such a way that it tends to assume a square aspect ratio.

The final portion of the present method is the operation in the basic loop when in the EXPANDING state. This operation is illustrated on the right side of FIG. 5b. It will be assumed that the next random vertex, $v_{ir}$, has been selected.

The total force (the sum of all the spring forces acting on the vertex) of the selected vertex is calculated as $$f_{ir} = (f_x, f_y) \quad \text{Equ. (25)}$$

Then using a difference form of Newton's Second Law of Motion $$F = m_c \frac{\Delta v}{\Delta t} \quad \text{Equ. (26)}$$

we obtain $$\Delta v = \frac{F}{m_c} \Delta t \quad \text{Equ. (27)}$$

where $m_c$ is the "mass" of the cell.

The above relation is used to calculate a new velocity $S_{ir}$ for the selected vertex $v_{ir}$, as $$S_{ir} = (s_x, s_y) \quad \text{Equ. (28)}$$

where $$s_x = s_x^{old} + \delta * \frac{f_x}{m_{ir}} \quad \text{Equ. (29)}$$

$$s_y = s_y^{old} + \delta * \frac{f_y}{m_{ir}} \quad \text{Equ. (30)}$$

and $\delta = \Delta t$ (from Equ. 27).

Finally, a new position is calculated for the vertex based on these new velocities:

$$x_{ir}^{new} = x_{ir}^{old} + \delta * s_x \quad \text{Equ. (31)}$$

$$y_{ir}^{new} = y_{ir}^{old} + \delta * s_y \quad \text{Equ. (32)}$$

The main loop is then entered at the point at which the counter k is incremented.

Figure 7:
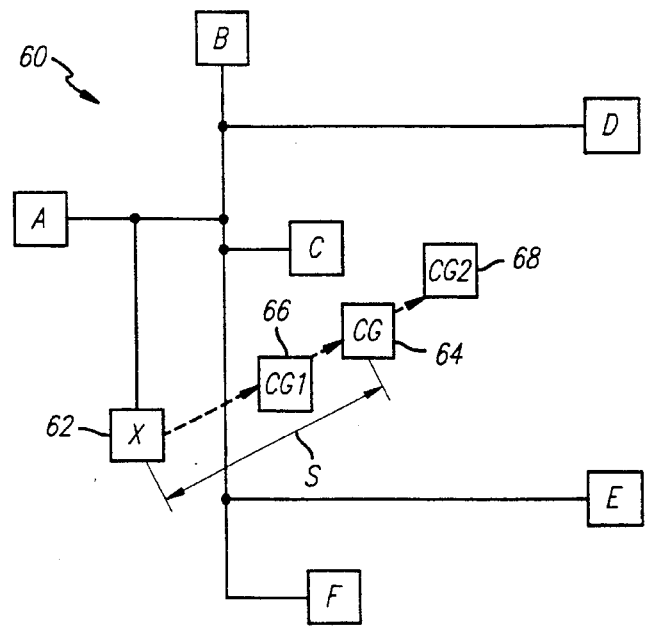
FIGS. 7 and 8 are diagrams illustrating a contraction operation of the present method.

The chaotic placement improvement or CONTRACTION operation of the present method described above is diagrammatically illustrated in FIG. 7. A net 60 constitutes a subset of a placement of cells, and includes a cell X in a current or initial location 62, and cells A to F that are interconnected with the cell X in the net 60. It will be noted that a netlist for the placement includes all of the nets and the cells that are interconnected thereby respectively. With the cell X in the initial location 62, the cell interconnect wirelength and fitness of the placement are assumed to be non-optimal.

The fitness of the placement is improved in accordance with the chaotic placement operation by relocating at least some of the cells to more suitable locations. This is done for each cell that is to be relocated by computing a location 64 of a centroid CG of the other cells in the net 60 and any other nets to which the cell X is connected. For the purposes of the invention, the term "centroid" is defined as a general term that can alternatively specify center of gravity, mass, force, area, etc.

It is within the scope of the invention to move the cell X directly to the centroid location 64. However, the effectiveness of the method is enhanced by utilizing the variable parameter lambda $\lambda$ as described above, and multiplying the distance S between the initial location 62 and the centroid location 64 by $\lambda$.

The cell X is then moved from the initial position 62 toward the centroid location 64 by a distance $\lambda S$, such that the distance of movement is proportional to the distance S. If $\lambda = 1$, the cell X will be moved exactly to the centroid location 64. If $\lambda$ is less than unity, the cell X will be moved to a location 66 between the initial location 62 and the centroid location 64 as indicated at CG1. If λ is greater than unity, the cell X will be moved beyond the centroid location 64 to a location 68 as indicated at CG2.

The value of λ is selected such that the cell relocation operations will cause the placement to converge toward an optimal configuration with maximum effectiveness. The factor λ is characterized as a "chaos" factor because as its value is increased, the placement optimization progressively diverges. A certain amount of chaos is necessary to prevent entrapment of the process at local fitness optima. However, if the chaos factor λ is too high, the process will diverge into a chaotic state in which the results become non-optimally random.

The present method of placement optimization can also be viewed using the theory of Cellular Automata (CA). The placement is represented as a 2D lattice, with each cell modelled by a finite-state automaton (FSA). The inputs to the FSA are the locations of neighboring cells and the locations of the cells to which the cell is connected through the netlist.

Each FSA consists of a cell state (current location), an input alphabet (positions of neighboring cells), and a transition function λS by which the move to the next location is computed. The CA model is executed for a series of iterations.

The dynamic behavior depends on the transition functions for the FSA and the parameter λ, which determines how far a cell will move during each iteration. For small values of λ, the system changes slowly and in some circumstances can become stuck, or "frozen" in a particular state. For moderate values of λ, the system will converge toward a low energy state. For large values of λ, the motion of the cells is chaotic and the system tends toward ever higher energy states.

Figure 8:
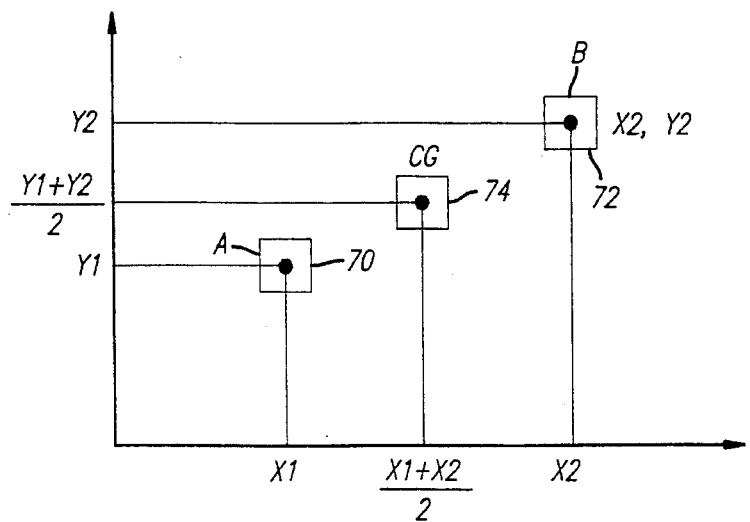

FIG. 8 illustrates how the centroid, in this case the center of gravity or "gravity point", is computed as the first step in determining the location to which a cell is to be moved. The center of gravity computation is illustrated for two cells, A and B, that are at locations 70 and 72 respectively.

The location 70 of the cell A is represented in an orthogonal system of x and y coordinates as x1,y1, whereas the location 72 of the cell B is represented as x2,y2. The x component of a location 74 of the center of gravity CG of the cells A and B is computed as the average of the x components of the locations 70 and 72, more specifically as (x1+x2)/2. The y component of the center of gravity CG is computed as the average of the y components of the locations 70 and 72, more specifically as (y1+y2)/2.

Although the computation for only two cells is illustrated in FIG. 8, it will be understood that the operation can be generalized for a net comprising any number of cells.

The centroids and values of λ are generally computed as continuous analog values in accordance with the invention. These analog values can be used per se, or can alternatively be rounded off to integer values corresponding to increments of the spacing between adjacent cell locations such that each new computed location corresponds exactly to a cell location of the placement. In the latter case, the optimization will tend to freeze at local fitness optima for values of λ less than unity, but will converge faster than in an application in which the analog values are used for values of λ greater than unity.

Various modifications will become possible for those skilled in the art after receiving the teachings of the present disclosure without departing from the scope thereof.

I claim:

1. A computer implemented method for improving a placement of cells for an integrated circuit chip, comprising the steps of:

(a) generating an initial placement of said cells;

(b) representing said cells as masses;

(c) representing interconnect nets of said cells as springs such that each spring is connected between two of said masses;

(d) performing a contraction operation by which said masses are moved toward a minimum energy configuration by forces of said springs;

(e) performing an expansion operation by which said masses are moved away from said minimum energy configuration; and (f) repeatedly performing steps (d) and (e) until an optimization criteria has been reached.

2. A method as in claim 1, in which step (d) comprises moving a plurality of said masses toward gravity points at which net forces on said plurality of said masses are zero respectively.

3. A method as in claim 2, in which step (d) comprises moving said plurality of said masses from current positions toward said gravity points by a predetermined percentage of distances between said current positions and said gravity points respectively.

4. A method as in claim 1, in which step (f) comprises the substeps of:

(f1) computing a potential energy of said masses in accordance with forces of said springs;

(f2) computing a kinetic energy of said masses in accordance with velocities thereof;

(f3) performing step (d) if said kinetic energy is above a first predetermined value; and (f4) performing step (e) if said potential energy is below a second predetermined value that is lower than said first predetermined value.

5. A computer implemented method for improving a placement of cells for an integrated circuit chip, comprising the steps of:

(a) generating an initial placement of said cells;

(b) representing said cells as masses;

(c) representing interconnect nets of said cells as springs such that each spring is connected between two of said masses;

(d) performing a contraction operation by which said masses are moved toward a minimum energy configuration by forces of said springs; and (e) performing an expansion operation by which said masses are moved away from said minimum energy configuration;

in which step (e) comprises the substeps of:

(e1) determining current positions of a plurality of said masses respectively;

(e2) determining current velocities of said plurality of said masses respectively;

(e3) computing net forces exerted by said springs on said plurality of said masses respectively;

(e4) computing new velocities of said plurality of said masses resulting from said net forces being applied thereto over a predetermined period of time; and (e5) computing new positions of said plurality of said masses in accordance with movement thereof from said current positions at said new velocities over said predetermined length of time.

6. A computer implemented method for improving a placement of cells for an integrated circuit chip, comprising the steps of:

(a) generating an initial placement of said cells;

(b) representing said cells as masses;

(c) representing interconnect nets of said cells as springs such that each spring is connected between two of said masses;

(d) performing a contraction operation by which said masses are moved toward a minimum energy configuration by forces of said springs; and (e) performing an expansion operation by which said masses are moved away from said minimum energy configuration;

in which step (e) comprises the substeps of:

(e1) computing a skew axis of said masses; and (e2) moving said masses away from said skew axis.

7. A method as in claim 6, in which step (e1) comprises computing said skew axis as a regression line.

8. A method as in claim 7, in which step (e2) comprises moving said masses perpendicular to said regression line.

9. A computer implemented method for improving a placement of cells for an integrated circuit chip, comprising the steps of:

(a) generating an initial placement of said cells;

(b) representing said cells as masses;

(c) representing interconnect nets of said cells as springs such that each spring is connected between two of said masses;

(d) performing a contraction operation by which said masses are moved toward a minimum energy configuration by forces of said springs; and (e) performing an expansion operation by which said masses are moved away from said minimum energy configuration, in which:

step (e) comprises the substeps of:

(f) computing a skew axis of said masses; and (g) moving said masses away from said skew axis;

step (f) comprises computing said skew axis as a regression line;

step (g) comprises moving said masses perpendicular to said regression line;

step (f) comprises the substeps of:

(f1) computing a variance of said masses along said regression line;

(f2) computing a bias perpendicular to said regression line in accordance with said variance; and step (g) comprises computing new velocities for said masses in accordance with said bias and current velocities of said masses.

10. A computer implemented method for improving a placement of cells for an integrated circuit chip, comprising the steps of:

(a) generating an initial placement of said cells;

(b) representing said cells as masses;

(c) representing interconnect nets of said cells as springs such that each spring is connected between two of said masses;

(d) performing a contraction operation by which said masses are moved toward a minimum energy configuration by forces of said springs; and (e) performing an expansion operation by which said masses are moved away from said minimum energy configuration; and (f) repeatedly performing steps (d) and (e) until an optimization criteria has been reached;

in which step (f) comprises the substeps of:

(f1) computing a total wirelength of said interconnect nets; and (f2) repeatedly performing steps (d) and (e) until said total wirelength is less than a predetermined value.

11. A computer implemented method for improving an arrangement of masses and nets that interconnect the masses, comprising the steps of:

(a) generating an initial arrangement of said masses;

(b) representing said nets as springs such that each spring is connected between two of said masses;

(c) performing a contraction operation by which said masses are moved toward a minimum energy configuration by forces of said springs;

(d) performing an expansion operation by which said masses are moved away from said minimum energy configuration; and (e) repeatedly performing steps (c) and (d) until an optimization criteria has been reached.

12. A method as in claim 11, in which step (c) comprises moving a plurality of said masses toward gravity points at which net forces on said plurality of said masses are zero respectively.

13. A method as in claim 12, in which step (c) comprises moving said plurality of said masses from current positions toward said gravity points by a predetermined percentage of distances between said current positions and said gravity points respectively.

14. A method as in claim 11, in which step (e) comprises the substeps of:

(e1) computing a potential energy of said masses in accordance with forces of said springs;

(e2) computing a kinetic energy of said masses in accordance with velocities thereof;

(e3) performing step (c) if said kinetic energy is above a first predetermined value; and (e4) performing step (d) if said potential energy is below a second predetermined value that is lower than said first predetermined value.

15. A computer implemented method for improving an arrangement of masses and nets that interconnect the masses, comprising the steps of:

(a) generating an initial arrangement of said masses;

(b) representing said nets as springs such that each spring is connected between two of said masses;

(c) performing a contraction operation by which said masses are moved toward a minimum energy configuration by forces of said springs;

(d) performing an expansion operation by which said masses are moved away from said minimum energy configuration;

in which step (d) comprises the substeps of:

(d1) determining current positions of a plurality of said masses respectively;

(d2) determining current velocities of said plurality of said masses respectively;

(d3) computing net forces exerted by said springs on said plurality of said masses respectively;

(d4) computing new velocities of said plurality of said masses resulting from said net forces being applied thereto over a predetermined period of time; and (d5) computing new positions of said plurality of said masses in accordance with movement thereof from said current positions at said new velocities over said predetermined length of time.

16. A computer implemented method for improving an arrangement of masses and nets that interconnect the masses, comprising the steps of:

(a) generating an initial arrangement of said masses;

(b) representing said nets as springs such that each spring is connected between two of said masses;

(c) performing a contraction operation by which said masses are moved toward a minimum energy configuration by forces of said springs;

(d) performing an expansion operation by which said masses are moved away from said minimum energy configuration;

in which step (d) comprises the substeps of:
  (d1) computing a skew axis of said masses; and
  (d2) moving said masses away from said skew axis.

17. A method as in claim 16, in which step (d1) comprises computing said skew axis as a regression line.

18. A method as in claim 17, in which step (d2) comprises moving said masses perpendicular to said regression line.

19. A computer implemented method for improving an arrangement of masses and nets that interconnect the masses, comprising the steps of:

(a) generating an initial arrangement of said masses;

(b) representing said nets as springs such that each spring is connected between two of said masses;

(c) performing a contraction operation by which said masses are moved toward a minimum energy configuration by forces of said springs;

(d) performing an expansion operation by which said masses are moved away from said minimum energy configuration, in which:

step (d) comprises the substeps of:
  (d1) computing a skew axis of said masses; and
  (d1) moving said masses away from said skew axis;
  step (e) comprises computing said skew axis as a regression line;
  step (f) comprises moving said masses perpendicular to said regression line;

step (e) comprises the substeps of:
  (e1) computing a variance of said masses along said regression line; and
  (e2) computing a bias perpendicular to said regression line in accordance with said variance; and step (f) comprises computing new velocities for said masses in accordance with said bias and current velocities of said masses.

20. A computer implemented method for improving an arrangement of masses and nets that interconnect the masses, comprising the steps of:

(a) generating an initial arrangement of said masses;

(b) representing said nets as springs such that each spring is connected between two of said masses;

(c) performing a contraction operation by which said masses are moved toward a minimum energy configuration by forces of said springs;

(d) performing an expansion operation by which said masses are moved away from said minimum energy configuration; and (e) repeatedly performing steps (c) and (d) until an optimization criteria has been reached;

in which step (e) comprises the substeps of:
  (e1) computing a total length of said nets; and
  (e2) repeatedly performing steps (c) and (d) until said total length is less than a predetermined value.

21. A physical design automation system for generating an optimized placement of cells for an integrated circuit chip, comprising:

initial placement generating means for generating an initial placement of said cells;

placement representation means for representing said cells as masses, and representing interconnect nets of said cells as springs such that each spring is connected between two of said masses;

contraction means for performing a contraction operation by which said masses are moved toward a minimum energy configuration by forces of said springs;

expansion means for performing an expansion operation by which said masses are moved away from said minimum energy configuration; and control means for controlling the contraction means and the expansion means to repeatedly perform said contraction operation and said expansion operation respectively until an optimization criteria has been reached.

22. A system as in claim 21, in which the contraction means moves a plurality of said masses toward gravity points at which net forces on said plurality of said masses are zero respectively.

23. A system as in claim 22, in which the contraction means moves said plurality of said masses from current positions toward said gravity points by a predetermined percentage of distances between said current positions and said gravity points respectively.

24. A system as in claim 21, in which:
  the control means comprises computing means for computing a potential energy of said masses in accordance with forces of said springs and computing a kinetic energy of said masses in accordance with velocities thereof;
  the control means controls the contraction means to perform said contraction operation if said kinetic energy is above a first predetermined value; and
  the control means controls the expansion means to perform said expansion operation if said potential energy is below a second predetermined value that is lower than said first predetermined value.

25. A system as in claim 21, in which the initial placement generating means, placement representation means, contraction means and expansion means collectively comprise a parallel processing system including a plurality of parallel processors.

26. A physical design automation system for generating an optimized placement of cells for an integrated circuit chip, comprising:

initial placement generating means for generating an initial placement of said cells;

placement representation means for representing said cells as masses, and representing interconnect nets of said cells as springs such that each spring is connected between two of said masses;

contraction means for performing a contraction operation by which said masses are moved toward a minimum energy configuration by forces of said springs; and expansion means for performing an expansion operation by which said masses are moved away from said minimum energy configuration;

in which the expansion means comprises:
  determination means for determining current positions of a plurality of said masses respectively, and determining current velocities of said plurality of said masses respectively;
  computing means for computing net forces exerted by said springs on said plurality of said masses respectively, computing new velocities of said plurality of said masses resulting from said net forces being applied thereto over a predetermined period of time, and computing new positions of said plurality of said masses in accordance with movement thereof from said current positions at said new velocities over said predetermined length of time.

27. A physical design automation system for generating an optimized placement of cells for an integrated circuit chip, comprising:

initial placement generating means for generating an initial placement of said cells;

placement representation means for representing said cells as masses, and representing interconnect nets of said cells as springs such that each spring is connected between two of said masses;

contraction means for performing a contraction operation by which said masses are moved toward a minimum energy configuration by forces of said springs; and expansion means for performing an expansion operation by which said masses are moved away from said minimum energy configuration, in which:

the computing means computes a skew axis of said masses; and the expansion means moves said masses away from said skew axis.

28. A system as in claim 27, in which the computing means computes said skew axis as a regression line.

29. A system as in claim 28, in which the expansion means moves said masses perpendicular to said regression line.

30. A physical design automation system for generating an optimized placement of cells for an integrated circuit chip, comprising:

initial placement generating means for generating an initial placement of said cells;

placement representation means for representing said cells as masses, and representing interconnect nets of said cells as springs such that each spring is connected between two of said masses;

contraction means for performing a contraction operation by which said masses are moved toward a minimum energy configuration by forces of said springs; and expansion means for performing an expansion operation by which said masses are moved away from said minimum energy configuration, in which:

the computing means computes a skew axis of said masses;

the expansion means moves said masses away from said skew axis;

the computing means computes said skew axis as a regression line;

the expansion means moves said masses perpendicular to said regression line; and the computing means computes a variance of said masses along said regression line, computes a bias perpendicular to said regression line in accordance with said variance, and computes new velocities for said masses in accordance with said bias and current velocities of said masses.

31. A physical design automation system for generating an optimized placement of cells for an integrated circuit chip, comprising:

initial placement generating means for generating an initial placement of said cells;

placement representation means for representing said cells as masses, and representing interconnect nets of said cells as springs such that each spring is connected between two of said masses;

contraction means for performing a contraction operation by which said masses are moved toward a minimum energy configuration by forces of said springs;

expansion means for performing an expansion operation by which said masses are moved away from said minimum energy configuration;

computing means for computing a total wirelength of said interconnect nets; and control means for repeatedly controlling the contraction means and the expansion means to perform said contraction operation and said expansion operation respectively until said total wirelength is less than a predetermined value.

* * * * *